(12) United States Patent
Dalmia et al.

(10) Patent No.: US 6,225,831 B1
(45) Date of Patent: *May 1, 2001

(54) PHASE DETECTOR

(75) Inventors: Kamal Dalmia; Mohammad J. Navabi; Bertrand J. Williams, all of Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/586,646

(22) Filed: Jun. 5, 2000

Related U.S. Application Data

(63) Continuation of application No. 09/216,465, filed on Dec. 18, 1998, now Pat. No. 6,072,337.

(51) Int. Cl.[7] .......................... G01R 25/00; H03D 13/00
(52) U.S. Cl. ................................................................ 327/12
(58) Field of Search ..................... 327/2, 3, 7, 8, 327/10, 12, 41, 43, 44, 150, 159, 236–238, 254, 225; 331/25; 375/375

(56) References Cited

U.S. PATENT DOCUMENTS

| | | | |
|---|---|---|---|
| 4,535,459 | 8/1985 | Hogge, Jr. ............................ | 375/80 |
| 5,138,281 | 8/1992 | Boudewijns ........................ | 331/1 A |
| 5,301,196 | 4/1994 | Ewen et al. ...................... | 370/105.2 |
| 5,384,551 | 1/1995 | Kennedy et al. .................... | 331/17 |
| 5,436,938 | 7/1995 | Pigeon ............................... | 375/376 |
| 5,614,855 | 3/1997 | Lee et al. ............................ | 327/158 |
| 5,754,080 | 5/1998 | Chen et al. .......................... | 331/25 |
| 5,808,498 | 9/1998 | Donnelly et al. .................. | 327/255 |
| 5,825,209 | 10/1998 | Stark et al. ............................ | 327/3 |
| 5,834,950 | 11/1998 | Co et al. ............................. | 327/12 |
| 5,926,041 | 7/1999 | Duffy et al. ......................... | 327/12 |
| 5,933,031 | 8/1999 | Konno ................................... | 327/7 |
| 5,936,430 * | 8/1999 | Patterson ............................ | 327/159 |
| 5,939,901 | 8/1999 | Geddes .................................. | 327/3 |
| 5,955,906 | 9/1999 | Yamaguchi ........................ | 327/259 |
| 5,963,058 | 10/1999 | Thomas ................................. | 327/3 |
| 5,963,059 | 10/1999 | Partovi et al. ...................... | 327/12 |
| 5,977,801 | 11/1999 | Boerstler ............................. | 327/7 |
| 6,014,042 | 1/2000 | Nguyen ................................. | 327/3 |
| 6,026,134 | 2/2000 | Duffy et al. ........................ | 375/376 |
| 6,064,235 | 5/2000 | Hayashi et al. ....................... | 327/2 |
| 6,075,388 * | 6/2000 | Dalmia ................................ | 327/12 |
| 6,100,722 * | 8/2000 | Dalmia ................................ | 327/12 |

OTHER PUBLICATIONS

A 0.8–$\mu$m CMOS 2.5 Gb/s Oversampling Receiver and Transmitter for Serial Links, By: Chih–Kong Ken Yang and Mark A. Horowitz, IEEE Journal of Solid–State Circuits, vol. 31, No. 12, Dec. 1996, pp. 2015–2023.

FP 15.3: A 1.25Gb/s, 460mW CMOS Transceiver for Serial Data Communication, By: Dao–Long Chen, Michael O. Baker, 1997 IEEE International Solid–State Circuits Conference, pp. 242–243.

FP 15.1: A 1.0625Gbps Transceiver with 2x–Oversampling and Transmit Signal Pre–Emphasis, By: Alan Fiedler, Ross Mactaggart, James Welch, Shoba Krishnan, 1997 IEEE International Solid–State Circuits Conference, pp. 238–239.

Kamal Dalmia, U.S.S.N. 09/302,214, Clock and Data Recovery PLL Based on Parallel Architecture, filed Apr. 29, 1999.

(List continued on next page.)

Primary Examiner—My-Trang Nuton
(74) Attorney, Agent, or Firm—Christopher P. Maiorana, P.C.

(57) ABSTRACT

A circuit comprising a pump-up circuit and a pump-down circuit. The pump-up circuit may be configured to generate a pump-up signal in response to (i) a data signal and a clock signal. The pump-down circuit may be configured to generate a pump-down signal in response to (i) the data signal, (ii) the clock signal, and (iii) a quadrature of the clock signal.

20 Claims, 4 Drawing Sheets

OTHER PUBLICATIONS

Kamal Dalmia, U.S.S.N. 09/302,213, Phase Detector with Extended Linear Range, filed Apr. 29, 1999.

Kamal Dalmia, U.S.S.N. 09/283,058, Method, Architecture and Circuit for Half–Rate Clock and/or Data Recovery, filed Apr. 1, 1999.

* cited by examiner

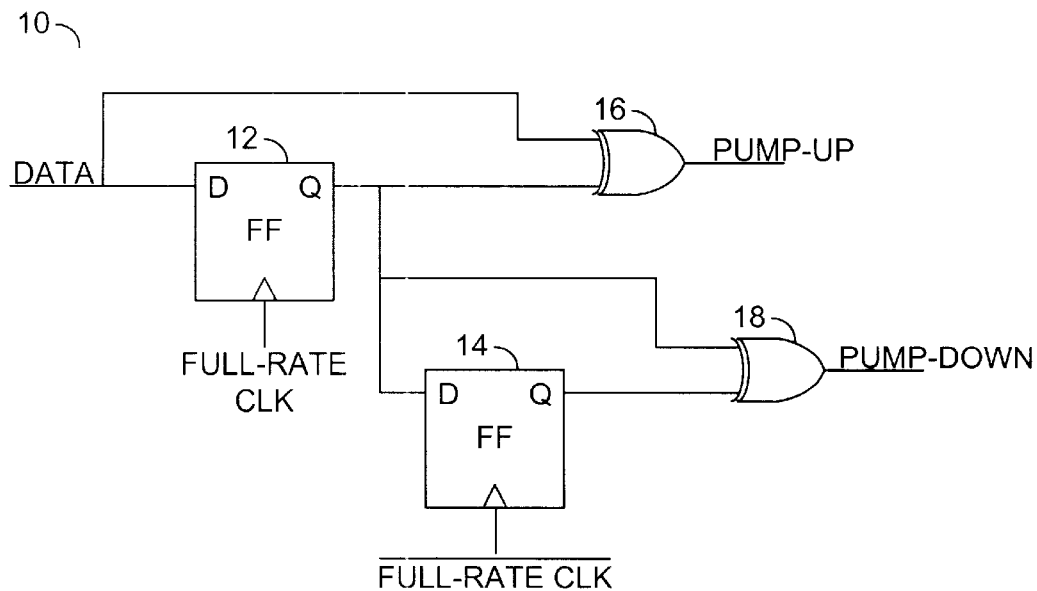
FIG. 1
(CONVENTIONAL)
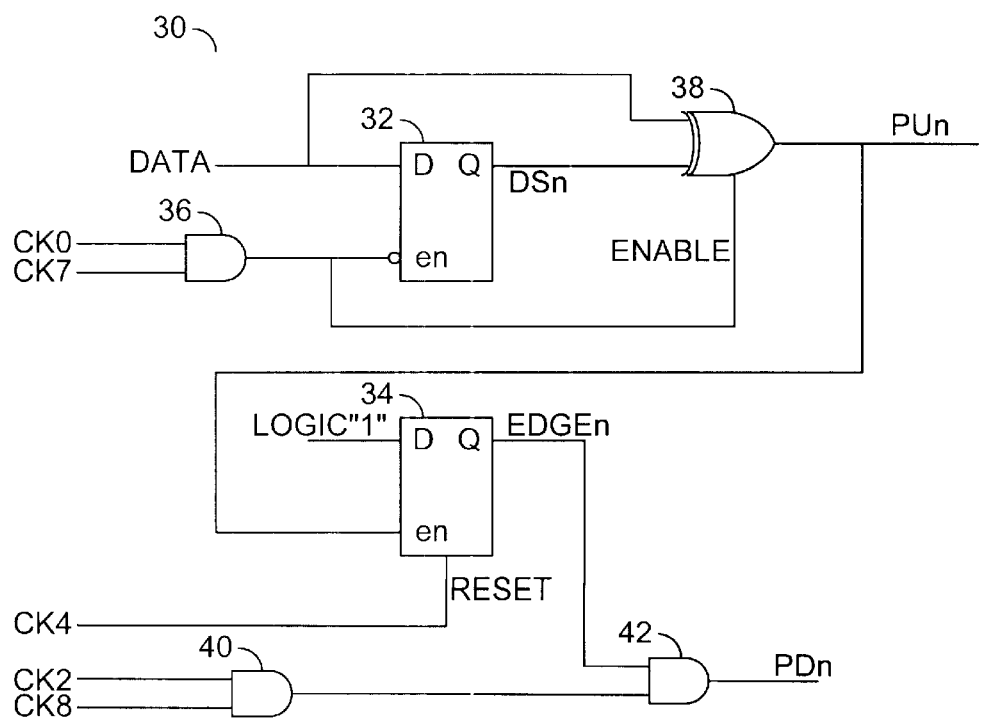
FIG. 2
(CONVENTIONAL)

PHASE DETECTOR

This is a continuation of U.S. Ser. No. 09/216,465, filed Dec. 18, 1998, now U.S. Pat. No. 6,072,337.

FIELD OF THE INVENTION

The present invention relates to phase detectors generally and, more particularly, to a linear phase-detector used as in an analog phase-locked loop for data and clock recovery.

BACKGROUND OF THE INVENTION

Phase-detectors are logic circuits used to generate "pump-up" and "pump-down" signals to control a charge-pump circuit in a clock and data recovery PLL. Phase-detectors are also used to generate recovered data. As the operating speed of clock and data recovery circuits increases, the design of voltage-controlled oscillators (VCOs) becomes more complicated. High speed VCOs also consume more power.

Conventional phase-detector architectures use a full-rate clock. Some conventional architectures use multiple phases of a lower-rate clock but have non-linear characteristics or reduced linear range.

Referring to FIG. 1, a circuit 10 illustrating a conventional approach for implementing a phase-detector based on a "full-rate" clock is shown. A full-rate clock is defined as a clock signal having a frequency (measured in Hertz) that is numerically equal to the data rate (measured in bits/second). The circuit 10 comprises a flip-flop 12, a flip-flop 14, an XOR gate 16 and an XOR gate 18. The XOR gate 16 generates a "pump-up" signal in response to a signal DATA and clocked-data input. The clocked-data input is generated by the flip-flop 12 in response to the signal DATA. The XOR gate 18 generates a "pump-down" signal using the output of the flip-flops 12 and 14. The circuit 10 illustrates a phase-detector having linear phase-difference vs. gain characteristics.

The circuit 10 requires a full-rate clock which is more difficult to generate than a slower rate clock. In a PLL application, such a phase-detector would require a VCO (not shown) to run at the full-rate. As a result, the VCO would consume more power and would be more difficult to design than a VCO running at a slower rate.

Referring to FIG. 2, a circuit 30 illustrating a second approach for implementing a phase detector is shown. The circuit 30 generally comprises a latch 32, a latch 34, an AND gate 36, an XOR gate 38, a NAND gate 40 and a NAND gate 42. The circuit 30 illustrates one of "n" parallel structures in an "n" bit parallel phase detector. The XOR gate 38 presents the pump-up signal PUn and the NAND gate 42 presents the pump-down signal PDn. The pump-down signal PDn is generated in response to the pump-up signal PUn through the latch 34.

The circuit 30 relies on pump-up signal PUn for the generation of the pump-down signal PDn. As the phase-difference between the clock and the signal DATA decreases, the pump-up signal PUn becomes narrower and may fail to trigger the pump-down latch 34, which may cause the pump-down signal PDn not to trigger in some applications. As a result, a non-linear operation may occur.

SUMMARY OF THE INVENTION

The present invention concerns a circuit comprising a pump-up circuit and a pump-down circuit. The pump-up circuit may be configured to generate a pump-up signal in response to (i) a data signal and a clock signal. The pump-down circuit may be configured to generate a pump-down signal in response to (i) the data signal, (ii) the clock signal, and (iii) a quadrature of the clock signal.

The objects, features and advantages of the present invention include providing a phase detector that (i) may operate at a reduced clock rate, (ii) may generate a pump-up signal independently of a pump-down signal, (iii) may reduce the power dissipated in high speed clock and data recovery circuits, (iv) may provide a linear output, (v) does not require full-rate clock signals to generate the pump-up and pump-down signals, and (vi) generates the pump-up and pump-down signals separately, allowing better control over the linearity characteristics of the gain curve.

BRIEF DESCRIPTION OF THE DRAWINGS

These and other objects, features and advantages of the present invention will be apparent from the following detailed description and the appended claims and drawings in which:

FIG. 1 illustrates a conventional approach for implementing a phase detector;

FIG. 2 illustrates an approach for implementing a phase detector;

DETAILED DESCRIPTION OF THE PREFERRED EMBODIMENTS

The present invention may be implemented as a 2x parallel sampling phase-detector using half-rate clock and a 90 degree shifted half-rate clock. A first and second latch may operate on data transitions of the data edges during a half-rate clock "high" and "low" cycle, respectively. A gate may combine the edge transition information to generate a pump-up signal. A pump-down signal may be generated from the data (e.g., without relying on the pump-up signal) by creating a half-bit pulse for every data-edge shifted by a half-bit.

Figure 3:
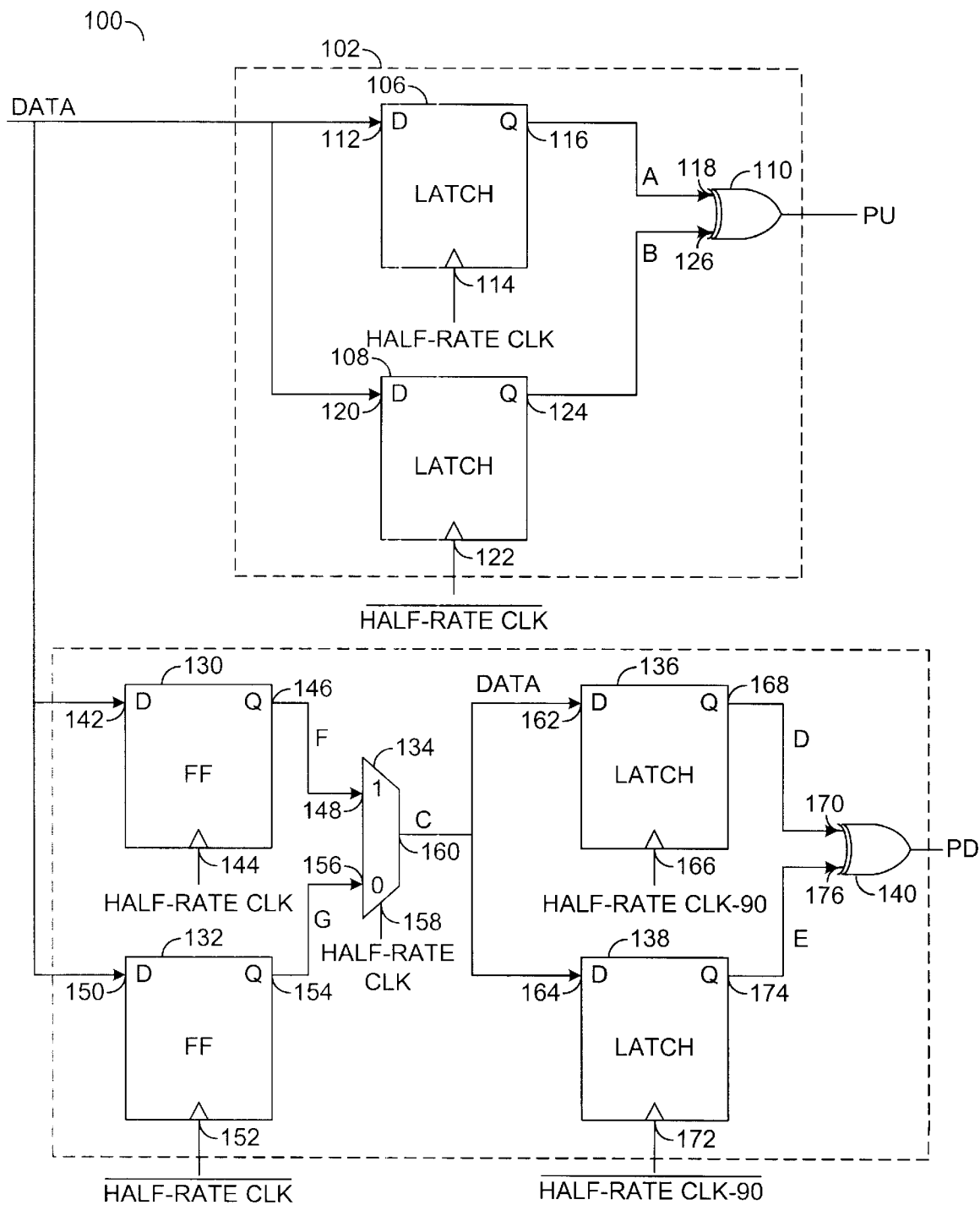
FIG. 3 illustrates a preferred embodiment of the present invention.

Referring to FIG. 3, a circuit 100 is shown implementing a preferred embodiment of the present invention. The circuit 100 generally comprises a pump-up block (or circuit) 102 and a pump-down block (or circuit) 104. The pump-up block 102 may be configured to present a pump-up signal (e.g., PU) in response to (i) an input data signal (e.g., DATA) and (ii) a half-rate clock (e.g., half-rate CLK). The pump-down block 104 may be configured to present a pump-down signal (e.g., PD) in response to (i) the input data signal DATA, (ii) the signal half-rate CLK and (iii) a quadrature of the signal half-rate CLK (e.g., half-rate CLK-90).

The pump-up circuit 102 generally comprises a latch 106, a latch 108 and a gate 110. The latch 106 generally includes an input 112 that may receive the input data signal DATA, an input 114 that may receive the signal half-rate CLK and an output 116 that may present a signal (e.g., A) to an input 118 of the gate 110. The latch 108 may have an input 120 that may receive the input data signal DATA, an input 122 that may receive a complement of the signal half-rate CLK (i.e., half-rate CLKB) and an output 124 that may present a signal (e.g., B) to an input 126 of the gate 110. The gate 110 may present the pump-up signal PU in response to the signal A and the signal B.

The pump-down block 104 generally comprises a flip-flop 130, a flip-flop 132, a multiplexer 134, a latch 136, a latch 138, and a gate 140. The flip-flop 130 may have an input 142 that may receive the signal DATA, an input 144 that may receive the signal half-rate CLK and an output 146 that may present a signal (e.g., F) to an input 148 of the multiplexer 134. The flip-flop 132 may have an input 150 that may receive the signal DATA, an input 152 that may receive the signal half-rate CLKB and an output 154 that may present a signal (e.g., G) to an input 156 of the multiplexer 134. The multiplexer 134 may also have an input 158 that may receive the signal half-rate CLK. The multiplexer 134 may also have an output 160 that may present a signal (e.g., C) to an input 162 of the latch 136 as well as to an input 164 of the latch 138. The latch 136 may also have an input 166 that may receive a signal half-rate CLK-90 (e.g., a quadrature of the signal half-rate CLK) and an output 168 that may present a signal (e.g., D) to an input 170 of the gate 140. The latch 138 may also have an input 172 that may receive the signal half-rate CLK-90B (which may be a digital complement of the signal half-rate CLK-90) and an output 174 that may present a signal (e.g., E) to an input 176 of the gate 140. The gate 140 may present the pull-down signal PD in response to the signal D and the signal E. The gate 110 may be implemented, in one example, as an XOR gate. However, other gates may be implemented to accommodate various polarities of the signal A and B.

Figure 4:
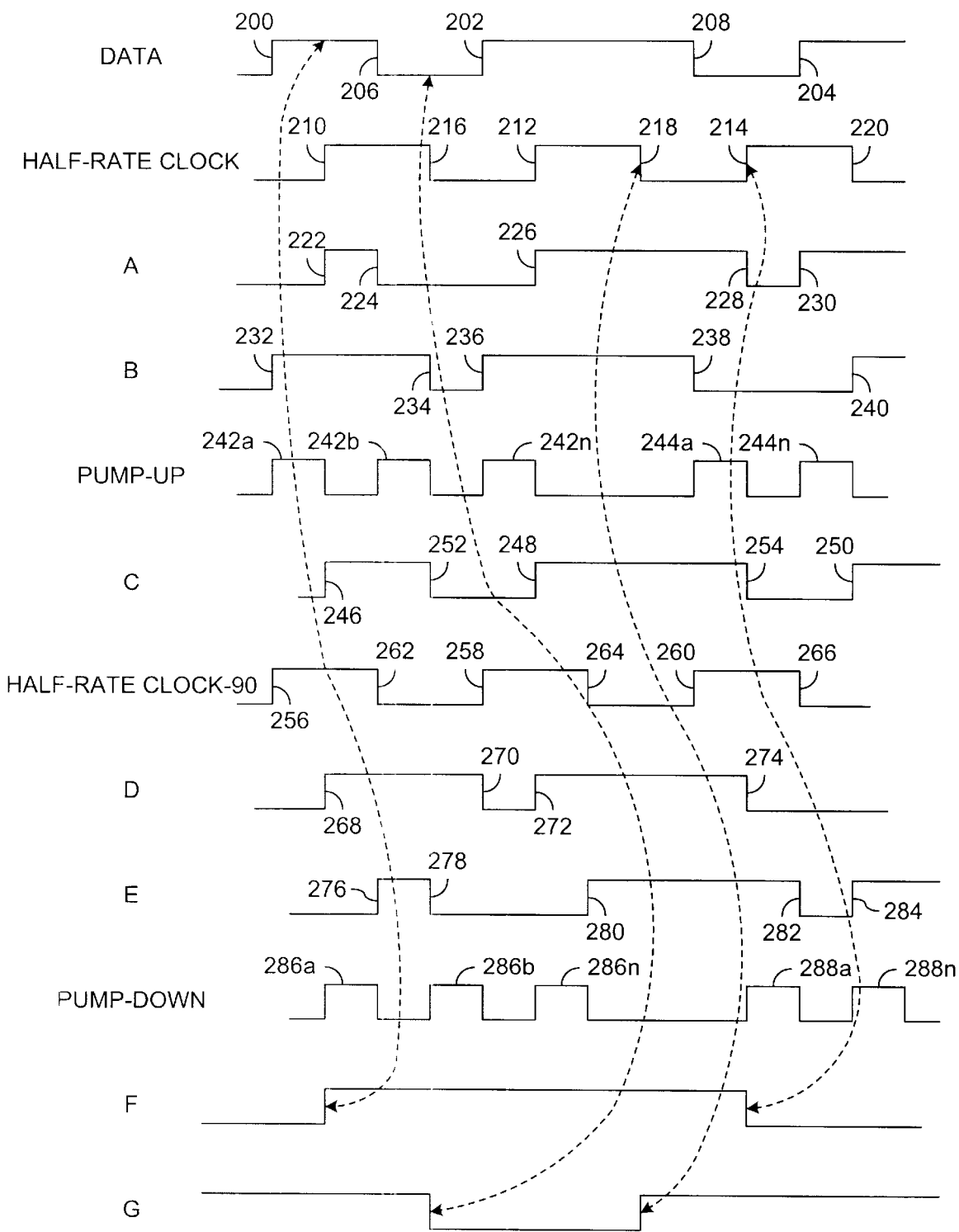
FIG. 4 illustrates a timing diagram illustrating a number of waveforms in accordance with a preferred embodiment of the present invention.

As shown in FIGS. 3 and 4, the pump-up signal PU may be generated in response to the latch 106, the latch 108 and the XOR gate 110. The latch 106 generally latches the signal DATA during the "high" cycles of the signal half-rate CLK (to be described in more detail in connection with FIG. 4). The latch 108 may latch the signal DATA during the "low" cycles of the signal half-rate CLK. The latched data (i.e., the signals A and B) may be fed into the XOR gate 110 which, in turn, may generate the pump-up signal PU.

The pump-down signal PD may be generated by shifting the data by a half-bit. The half-bit shift may be done by using the flip-flops 130 and 132 to clock the signal DATA and the multiplexer 134 to recombine the shifted data into the signal C. The recombined data may then be presented to the latches 136 and 138. The latch 136 may latch the shifted data during the high cycles of the signal half-rate CLK-90. The latch 138 may latch the shifted data during the low cycle of the signal half-rate CLK-90.

Referring to FIG. 4, a timing diagram of the various waveforms of the circuit 100 is shown. The signal DATA is shown having a positive transition 200, a positive transition 202, a positive transition 204, a negative transition 206 and a negative transition 208. The signal half-rate CLK is shown having a positive transition 210, a positive transition 212, a positive transition 214, a negative transition 216, a negative transition 218 and a negative transition 220. The signal A is shown having a positive transition 222, a negative transition 224, a positive transition 226, a negative transition 228 and a positive transition 230. The positive transition 222 generally responds to the positive transition 210 of the signal half-rate CLK. The negative transition 224 generally responds to the negative transition 206 of the signal DATA. The positive transition 226 generally responds to the positive transition 212 of the signal half-rate CLK. The negative transition 228 generally responds to the positive transition 214 of the signal half-rate CLK. The positive transition 230 generally responds to the positive transition 204 of the signal DATA.

The signal B generally has a positive transition 232 that generally responds to the positive transition 200, a negative transition 204 that generally responds to the negative transition 216, a positive transition 236 that generally responds to the positive transition 202, a negative transition 238 that generally responds to the negative transition 208 and a positive transition 240 that generally responds to the negative transition 220.

The signal pump-up generally comprises a number of pulses 242a–242n and a number of pulses 244a–244n. The positive pulses 242a–242n generally occur when either the signal A or the signal B is in a high state, which generally defines the function of the gate 110. The pulse 242a generally occurs since the signal B is high. Similarly, the pulse 242b generally occurs because the signal B is high and pulse 242n generally occurs because the signal B is high. The space between the pulse 242a and 242b generally occurs since the signal A and signal B are both high. The space between the pulse 242b and the pulse 242n generally occurs because the signal A and the signal B are both low. The pulses 244a–244n are generated in a similar fashion to the pulses 242a–242n.

The flip-flop 130 may sample the data at the rising edge of the signal half-rate clock CLK to generate the signal F. The flip-flop 132 may sample the data at the falling edge of the signal half-rate clock CLK to generate the signal G. The multiplexer 134 generally selects the signal F during a positive (e.g., high) half of the signal half-rate clock CLK and generally selects the signal G during negative (e.g., low) cycle of the signal half-rate clock CLK, thus generating a shifted data stream.

The signal C, which is generally presented by the multiplexer 134, has a positive transition 246, a positive transition 248, a positive transition 250, a negative transition 252 and a negative transition 254. The positive transition 246 generally responds to the positive transition 210, the negative transition 252 generally responds to the negative transition 216, the positive transition 248 generally responds to the positive transition 212, the negative transition 254 generally responds to the positive transition 214 and the positive transition 250 generally responds to the negative transition 220. The signal C may be a reconstructed data stream that may be synchronized to the positive and negative edges of the signal half-rate CLK.

The signal half-rate CLK-90 generally has a positive transition 256, a positive transition 258, a positive transition 260, a negative transition 262, a negative transition 264 and a negative transition 266. The signal half-rate CLK-90 is generally a quadrature of the signal half-rate CLK (e.g., phase shifted 90 degrees).

The signal D has a positive transition 268 that responds to the positive transition 246 a negative transition 270 that responds to the positive transition 258, a positive transition 272 that generally responds to the positive transition 248 and a negative transition 274 that generally responds to the negative transition 254. The signal E may have a positive transition 276 that may respond to the negative transition 262, a negative transition 278 that may respond to the negative transition 252, a positive transition 280 that may respond to the negative transition 264, a negative transition 282 that may respond to the negative transition 266 and a positive transition 284 that may respond to the positive transition 250.

The signal pump-down has a number of pulses 286a–286n and a number of pulses 288a–288n. The pulses 286a–286n are generally generated when either the signal D or signal E is in a logic high state. Similarly, the pulses 288a–288n are generated when the signal D or signal E are in a high state.

The width of the pump-up pulses 242a–242n and 244a–244n and the width of the pulses 286a–286n and the pulses 288a–288n may be independently varied by adjusting the loading at the outputs of the latches 106 and 108 and by adjusting the clock to Q delay of various latches and flip-flops.

Figure 5:
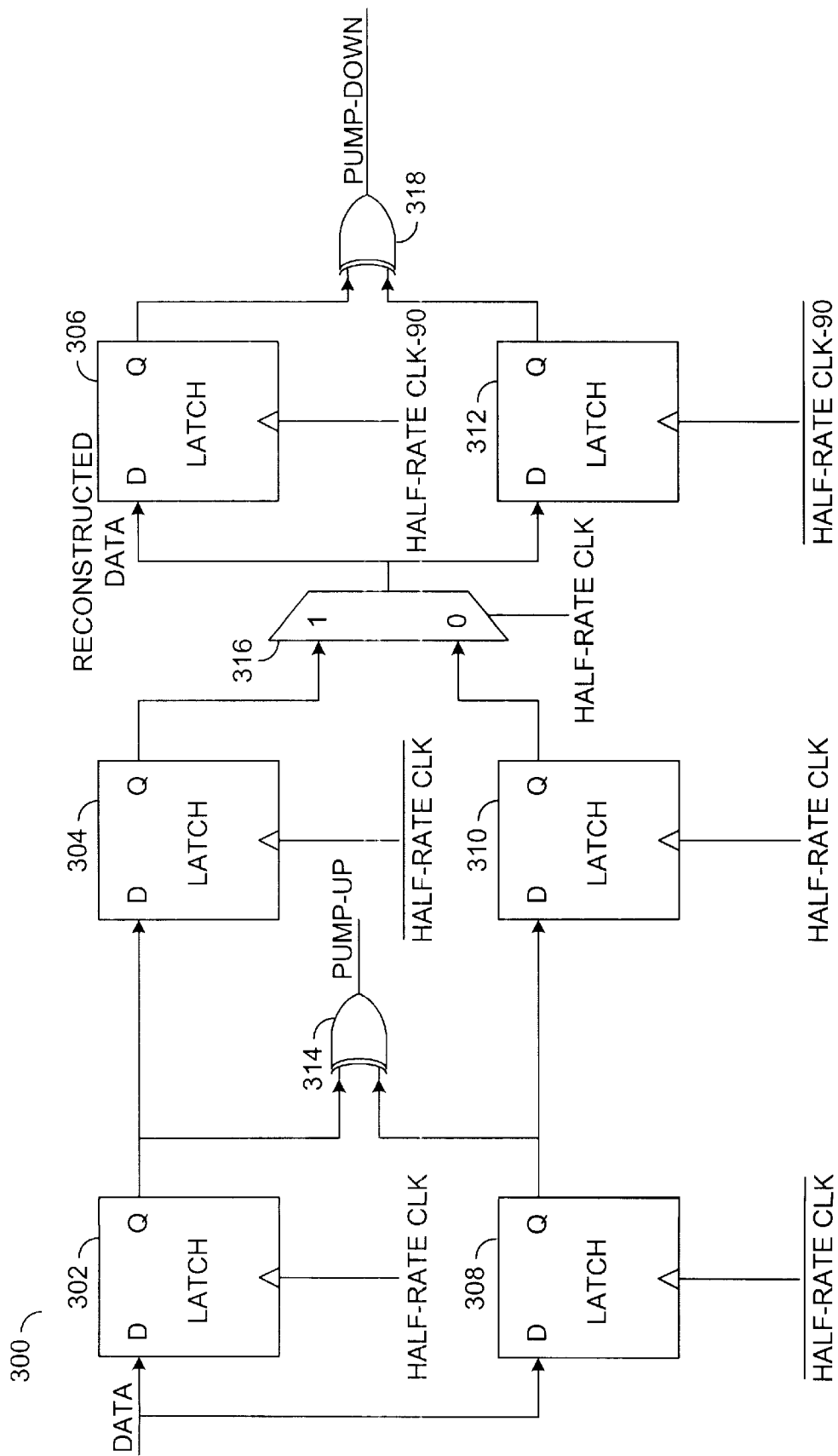
FIG. 5 illustrates an alternate embodiment of the present invention.

Referring to FIG. 5, a circuit 300 is shown illustrating an alternate implementation of the present invention. The circuit 300 generally comprises a latch 302, a latch 304, a latch 306, a latch 308, a latch 310, a latch 312, a gate 314, a multiplexer 316 and a gate 318. The circuit 300 differs from the circuit 100 in that the flip-flops 130 and 133 are generally broken into two latches (302 and 304) and (308 and 310), respectively. The latches 302 and 308 may be used to generate the signal pump-up PU. The circuit 300 may be implemented using fewer gates than the circuit 100. However, since the pump-up and pump-down portion now share some circuit components, the widths of the signal pump-up PU and pump-down PD may not be independently controlled.

While the circuit 300 may share some circuitry (e.g., the latch 302 and the latch 308, the single pump-up PU and the signal pump-down PD are still generated independently of each other. Specifically, the signal pump-up PD may be generated in response to (i) the signal DATA and (ii) the signal half-rate CLK and the signal pump-down PD may be generated in response to (i) the signal DATA, (ii) the signal half-rate CLK and (iii) the signal half-rate CLK-90.

The present invention may be used to implement phase-detector that generates pump-up and pump-down signals in response to two or more of (i) the data input signal DATA, (ii) a half-rate clock, and (iii) a 90 degree shifted half-rate clock (i.e., a quadrature). The phase-detector may have a linear gain vs. phase-error response. The phase-detector may generate the pump-up and pump-down signals independently from each other. The present invention may be applicable to high-speed clock and data-recovery applications where reducing power dissipation is a major design criteria.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a pump-up circuit configured to generate a pump-up signal in response to (i) a data signal and (ii) a clock signal; and
    a pump-down circuit configured to generate a pump-down signal in response to (i) said data signal, (ii) said clock signal, and (iii) a quadrature of said clock signal.

2. The circuit according to claim 1, wherein:
    said pump-up circuit is further configured to generate said pump-up signal in direct response to said data signal and said clock signal; and
    said pump-down circuit is further configured to generate said pump-down signal in direct response to said data signal and said clock signal.

3. The circuit according to claim 2, wherein said pump-up signal and said pump-down signal are independently generated.

4. The circuit according to claim 1, wherein:
    said pump-up circuit is further configured to independently generate said pump-up signal; and
    said pump-down circuit is further configured to independently generate said pump-down signal.

5. The circuit according to claim 1, wherein a width of said pump-up signal varies with a relative position of the data signal to the clock signal and a width of said pump-down signal is fixed.

6. The circuit according to claim 1, wherein:
    said pump-up signal comprises a first one or more pulses; and
    said pump-down signal comprises a second one or more pulses, wherein the width of said first one or more pulses of said pump-up signal are independently varied with respect to a width of the second one or more pulses of said pump-down signal.

7. The circuit according to claim 1, wherein said clock signal comprises a half-rate clock and said quadrature of said clock signal comprises a 90 degree phase shift of said clock signal.

8. The circuit according to claim 1, wherein said pump-up circuit comprises:
    a first latch circuit configured to generate a first control signal in response to (i) said data signal and (ii) said clock signal;
    a second latch configured to generate a second control signal in response to (i) said data signal and (ii) a digital complement of said clock signal; and
    a first gate circuit configured to generate said pump-up signal in response to (i) said first control signal and (ii) said second control signal.

9. The circuit according to claim 8, wherein said pump-down circuit comprises:
    a third latch circuit configured to generate a third control signal in response to (i) a shifted data signal and (ii) said quadrature of said clock signal;
    a fourth latch configured to generate a fourth control signal in response to (i) said shifted data signal and (ii) a digital complement of said quadrature of said clock signal; and
    a second gate circuit configured to generate said pump-up signal in response to (i) said third control signal and (ii) said fourth control signal.

10. The circuit according to claim 9, wherein said first and second gates each comprise an exclusive OR gate.

11. The circuit according to claim 9, wherein said pump-down circuit further comprises:
    a first flip-flop circuit configured to generate a fifth control signal in response to (i) said data signal and (ii) said clock signal;
    a second flip-flop configured to generate a sixth control signal in response to (i) said data signal and (ii) a digital complement of said clock signal; and
    a multiplexer circuit configured to generate said shifted data signal in response to (i) said fifth control signal and (ii) said sixth control signal.

12. A circuit comprising:
    means for generating a pump-up signal in response to (i) a data signal and (ii) a clock signal; and
    means for generating a pump-down signal in response to (i) said data signal, (ii) said clock signal, and (iii) a quadrature of said clock signal.

13. A method for generating control signals comprising the steps of:
    (A) generating a pump-up signal in response to (i) a data signal and (ii) a clock signal; and
    (B) generating a pump-down signal in response to (i) said data signal, (ii) said clock signal, and (iii) a quadrature of said clock signal.

14. The method according to claim 13, wherein:

step (A) further comprises generating said pump-up signal in direct response to said data signal and said clock signal; and step (B) further comprises generating said pump-down signal in direct response to said data signal and said clock signal.

15. The method according to claim 14, wherein step (A) and step (B) further comprise independently generating said pump-up and pump-down signals.

16. The method according to claim 13, wherein:

step (A) further comprises independently generating said pump-up signal; and step (B) further comprises independently generating said pump-down signal.

17. The method according to claim 13, further comprising the step of:

varying a width of said pump-up signal with a relative position of the data signal to the clock signal; and fixing a width of said pump-down signal.

18. The method according to claim 13, wherein step (B) further comprises shifting said data signal by a half-bit.

19. The method according to claim 18, wherein said shifting is generated by a first flip-flop, a second flip-flop and a multiplexer.

20. The method according to claim 19, further comprising the step of:

recombining the shifted data using said multiplexer.

\* \* \* \* \*